US009570021B2

(12) United States Patent
Zou et al.

(10) Patent No.: US 9,570,021 B2
(45) Date of Patent: Feb. 14, 2017

(54) ARRAY SUBSTRATE, FLEXIBLE DISPLAY DEVICE AND ELECTRONIC DEVICE

(71) Applicant: BOE TECHNOLOGY GROUP CO., LTD., Beijing (CN)

(72) Inventors: Xiangxiang Zou, Beijing (CN); Wei Qin, Beijing (CN); Jianbo Xian, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 154 days.

(21) Appl. No.: 14/433,792

(22) PCT Filed: Sep. 3, 2014

(86) PCT No.: PCT/CN2014/085862
§ 371 (c)(1),
(2) Date: Apr. 6, 2015

(87) PCT Pub. No.: WO2015/149478
PCT Pub. Date: Oct. 8, 2015

(65) Prior Publication Data
US 2016/0307528 A1 Oct. 20, 2016

(30) Foreign Application Priority Data
Apr. 2, 2014 (CN) .......................... 2014 1 0132420

(51) Int. Cl.
*G09G 3/20* (2006.01)
*G09G 3/36* (2006.01)
(Continued)

(52) U.S. Cl.
CPC ....... *G09G 3/3648* (2013.01); *G02F 1/136286* (2013.01); *H01L 27/124* (2013.01);
(Continued)

(58) Field of Classification Search
CPC .... H01L 27/12; G09G 3/20; G09G 2310/0272
See application file for complete search history.

(56) References Cited

U.S. PATENT DOCUMENTS

| 2009/0051640 A1 | 2/2009 | Tanaka et al. |
| 2013/0161626 A1* | 6/2013 | Jo .................. H01L 27/156 257/59 |
| 2014/0055702 A1 | 2/2014 | Park et al. |

FOREIGN PATENT DOCUMENTS

| CN | 103454821 A | 12/2013 |
| CN | 103454822 A | 12/2013 |

(Continued)

OTHER PUBLICATIONS

Office Action in Chinese Patent Application No. 201410132420.5, dated Jan. 25, 2016.
(Continued)

*Primary Examiner* — Tran Tran
(74) *Attorney, Agent, or Firm* — Bakerhostetler LLP

(57) ABSTRACT

The present disclosure provides an array substrate, a flexible display device and an electronic device. The array substrate includes a flexible substrate, and an array layer formed on the flexible substrate. The flexible substrate is bendable, and the array layer includes: signal transmission lines including a plurality of data lines and a plurality of gate lines which are arranged on the flexible substrate in a crisscross manner so as to define a plurality of subpixel regions; and a TFT arranged at each subpixel region and connected to the corresponding data line and gate line. At least portions of the signal transmission lines are formed as bending curves whose travelling direction is parallel to a side of the flexible substrate.

20 Claims, 5 Drawing Sheets

(51) Int. Cl.
    *G02F 1/1362* (2006.01)
    *H01L 27/12* (2006.01)
(52) U.S. Cl.
    CPC . *H01L 27/1218* (2013.01); *G09G 2300/0426* (2013.01); *G09G 2300/0809* (2013.01); *G09G 2310/0278* (2013.01); *G09G 2380/02* (2013.01)

(56) References Cited

FOREIGN PATENT DOCUMENTS

| CN | 103456743 A | 12/2013 |
|---|---|---|
| CN | 203445121 U | 2/2014 |
| CN | 103926774 A | 7/2014 |
| CN | 103956364 A | 7/2014 |
| CN | 104090439 A | 10/2014 |

OTHER PUBLICATIONS

International Search Report and Written Opinion in PCT International Application No. PCT/CN2014/085862, dated Dec. 31, 2014.
Office Action in Chinese Patent Application No. 201410132420.5, dated Jun. 20, 2016.

* cited by examiner

Unbendable Region    Bendable Region

ARRAY SUBSTRATE, FLEXIBLE DISPLAY DEVICE AND ELECTRONIC DEVICE

CROSS-REFERENCE TO RELATED APPLICATIONS

The present application is the U.S. National Phase of International Application No. PCT/CN2014/085862, filed on Sep. 3, 2014, and claims a priority to the International Application No. PCT/CN2014/085862, filed on Sep. 3, 2014 and to Chinese patent application No. 201410132420.5, filed on Apr. 2, 2014, which is are incorporated herein by reference in their entirety.

TECHNICAL FIELD

The present disclosure relates to the field of liquid crystal display technology, in particular to an array substrate, a flexible display device and an electronic device.

BACKGROUND

Flexible display device, as a new-generation display element, has an extensive application prospect in mobile phones, personal digital assistants (PDAs), digital cameras, vehicle-mounted terminals, laptop PCs, wall-mounted TVs and military applications due to its features such as being thin and light, high contrast, rapid response, wide viewing angle, high brightness and full color.

Currently, as shown in FIG. 1, an array substrate 5 of the flexible display device includes an unbendable region where a driver IC 1 is arranged, and a bendable region where a data line 3, a gate line 2 and a thin film transistor (TFT) 4 are arranged. A wiring arrangement of this array substrate is similar to that of an existing common display device, i.e., the data line 3 is perpendicular to the gate line 2, and the TFT 4 is located at a junction between the data line 3 and the gate line 2 to serve as a switch.

However, for the design of the existing array substrate, when a flexible display screen is bent, the metal lines will be bent and stretched as shown in FIG. 2. When the display device is bent in a manner as shown in FIG. 2, a signal transmission line 2 arranged in a horizontal direction will be bent in a manner as shown in FIG. 2 and thus will easily be broken. In this regard, there is a need to design a novel array substrate, so as to meet the requirements when the array substrate is bent and stretched, thereby to prevent the signal transmission line from being broken easily.

SUMMARY

An object of the present disclosure is to provide an array substrate, a flexible display device and an electronic device, so as to prevent a flexible array substrate in the related art from being easily broken when it is bent and stretched.

In one aspect, the present disclosure provides an array substrate, including a flexible substrate, and an array layer formed on the flexible substrate. The flexible substrate is bendable, and the array layer includes:

signal transmission lines including a plurality of data lines and a plurality of gate lines which are arranged on the flexible substrate in a crisscross manner so as to define a plurality of subpixel regions; and a TFT arranged at each subpixel region and connected to the corresponding data line and gate line, wherein at least portions of the signal transmission lines are formed as bending curves whose travelling direction is parallel to a side of the flexible substrate.

Alternatively, the bending curve is of a zigzag shape.

Alternatively, the side of the flexible substrate is bendable.

Alternatively, one of the data line and the gate line is a bending curve, while the other one of the data line and the gate line is an oblique straight line.

Alternatively, the signal transmission lines formed as the bending curves include a plurality of first line segments angled at a first angle relative to the side of the flexible substrate and a plurality of second line segments angled at a second angle relative to the side of the flexible substrate, and the plurality of first line segments and the plurality of second line segments are arranged alternately and connected to each other in an end-to-end manner.

Alternatively, the first line segments of the signal transmission lines are arranged at a plurality of first straight lines parallel to each other, and the second line segments are arranged at a plurality of second straight lines parallel to each other.

Alternatively, the first line segment is connected to the second line segment in an arc connection manner.

Alternatively, the signal transmission lines formed as the oblique straight lines intersect one of the first line segments and the second line segments, so as to define the subpixel region.

Alternatively, the signal transmission lines formed as the oblique straight lines are parallel to the other one of the first line segments and the second line segments.

Alternatively, the oblique straight line is angled at 45° or 135° relative to the side of the flexible substrate.

Alternatively, at regions where the data lines and the gate lines intersect each other, the data lines are perpendicular to the gate lines.

Alternatively, the gate lines and the data lines are formed on the flexible substrate sequentially, the data lines are arranged at an identical layer, the gate lines area arranged at an identical layer, and the data lines and the gate lines are arranged at different layers and separated from each other.

Alternatively, the array substrate further includes a driving module configured to output driving signals to the data lines and the gate lines.

Alternatively, the flexible substrate includes a bendable display region and an unbendable non-display region, and the driving module is arranged at the non-display region.

Alternatively, the driving module is configured to drive the data lines and the gate lines simultaneously, or includes a data driving module for driving the data lines individually and a gate driving module for driving the gate lines individually.

In another aspect, the present disclosure provides a flexible display device including the above-mentioned array substrate.

In yet another aspect, the present disclosure provides an electronic device including the above-mentioned flexible display device.

According to the embodiments of the present disclosure, portions of the signal transmission lines are formed as bending curves whose travelling direction is parallel to the side of the flexible substrate. In the case that the array substrate is bent to the same extent, the signal transmission lines in the array substrate in the embodiments of the present disclosure are bent to a relatively small extent as compared with those in the existing array substrate. As a result, it is able to improve the bendability of the array substrate, thereby to prevent the array substrate from being easily broken when it is bent or stretched.

DETAILED DESCRIPTION

In order to make the objects, the technical solutions and the advantages of the present disclosure to be more apparent, the present disclosure will be described hereinafter in conjunction with the drawings and the embodiments.

The present disclosure provides in an embodiment an array substrate including a flexible substrate, and an array layer formed on the flexible substrate. The flexible substrate is bendable, and the array layer includes:

signal transmission lines including a plurality of data lines and a plurality of gate lines which are arranged on the flexible substrate in a crisscross manner so as to define a plurality of subpixel regions; and a thin film transistor (TFT) arranged at each subpixel region and connected to the corresponding data line and gate line, wherein at least portions of the signal transmission lines are formed as bending curves whose travelling direction is parallel to a side of the flexible substrate.

According to the array substrate in the embodiment of the present disclosure, portions of the signal transmission lines are formed as the bending curves whose travelling direction is parallel to the side of the flexible substrate. As compared with the situation in the related art where the signal transmission lines are formed as straight lines parallel to the side of the flexible substrate, when the signal transmission lines consisting of the bending curves are formed on the flexible array substrate and bent, a larger bending radius will be obtained. In other words, in the case that the array substrate is bent to the same extent, the signal transmission lines in the array substrate in the embodiment of the present disclosure are bent to a relatively small extent as compared with those in the existing array substrate. As a result, it is able to improve the bendability of the array substrate, thereby to prevent the array substrate from being easily broken when it is bent or stretched.

In this embodiment, one of the data line and the gate line is a bending curve, while the other is an oblique straight line. Alternatively, the bending curve may be of a zigzag shape. For example, the gate line is formed as a zigzag bending curve extending in a direction parallel to a side of the flexible substrate while the data line is formed as a straight line oblique to the side of the flexible substrate; or the data line is formed as a zigzag bending curve whose travelling direction is parallel to a side of the flexible substrate while the gate line is a line oblique to the side of the flexible substrate.

Figure 1:
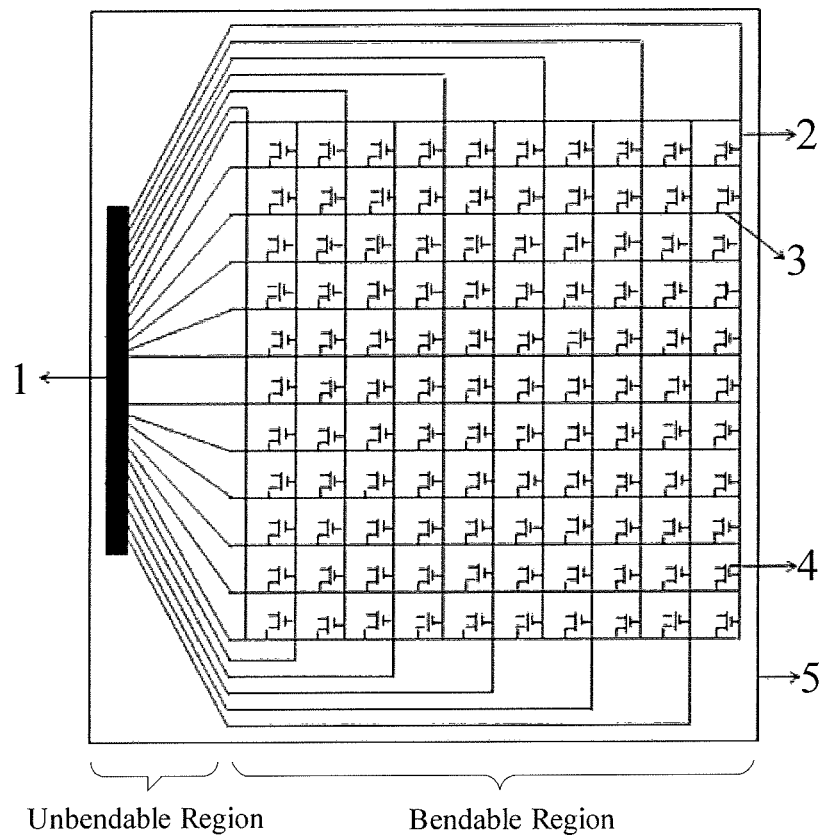
FIG. 1 is a schematic view showing an existing flexible array substrate.
Figure 2:
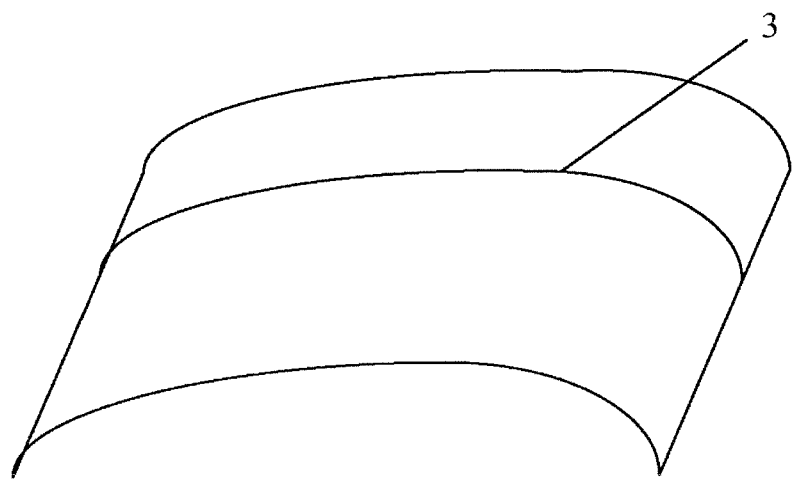
FIG. 2 is a schematic view showing a bending state of signal transmission lines when the existing flexible array substrate is bent.

Usually, the flexible substrate has a conventional bending state, as shown in FIG. 2. In this conventional bending state, two opposite sides may be curlable or bendable. Alternatively, in the embodiments of the present disclosure, the data line or gate line, whose extension direction is identical to an extension direction of the curlable or bendable side, is formed as a zigzag bending curve, and the other one thereof is formed as an oblique straight line.

Alternatively, no matter which ones of the signal transmission lines are formed as the bending curves and no matter which structure the bending curve has, portions of the data lines and the gate lines, which intersect each other so as to define one subpixel region, are perpendicular to each other.

Lines and angles between the lines will be defined as follows.

In the embodiments of the present disclosure, for ease of understanding, a concept "segment" is not strictly differentiated from a concept "straight line" in mathematics. For example, an angle between segments or between a segment and any other straight line (or a parallel relationship therebetween) mentioned in the embodiments of the present disclosure refers to an angle between straight lines where the segments are located or between a straight line where the segment is located and any other straight line (or a parallel relationship therebetween). In the embodiments of the present disclosure, an angle between the signal transmission lines and one side of the flexible substrate is defined as [0, 180]. The following description is given by taking the signal transmission lines and the sides of the flexible substrate being equivalent to straight lines as an example.

Figure 3A:
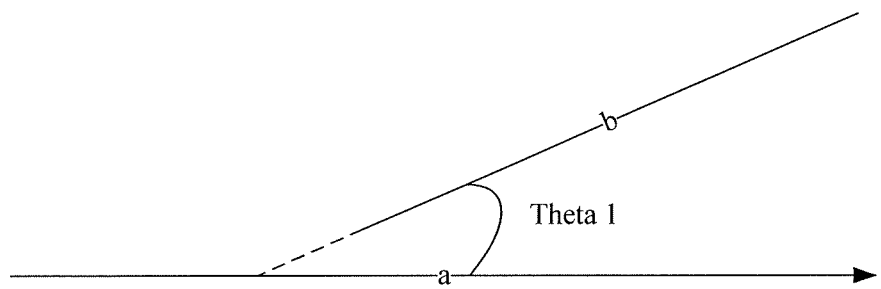
FIGS. 3a-3b are schematic views showing angles between signal transmission lines and a side of a flexible substrate according to one embodiment of the present disclosure.
Figure 3B:
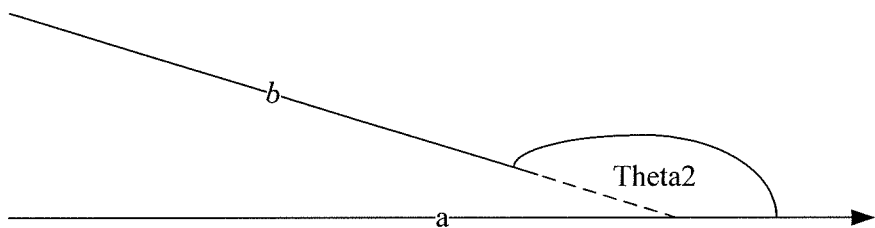

Presumed that a represents a side of the flexible substrate and its horizontally rightward direction is a positive direction, an angle between a signal transmission line b and the side a is Theta1 in FIG. 3a, while an angle between the signal transmission line b and the side a is Theta2 in FIG. 3b. When the side a is perpendicular to the line b, an angle between the line b and the side a is 90°, and when the side a is parallel to, or coincident with, the line b, an angle between the line b and the side a is 0°.

Figure 4:
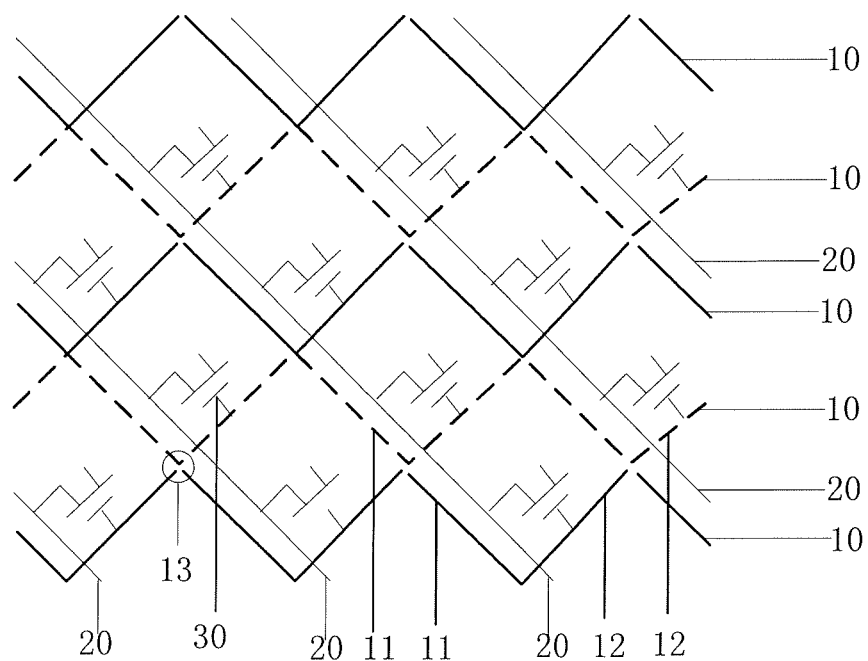
FIG. 4 is a partial, schematic view showing an array layer on an array substrate according to an embodiment of the present disclosure.
Figure 5:
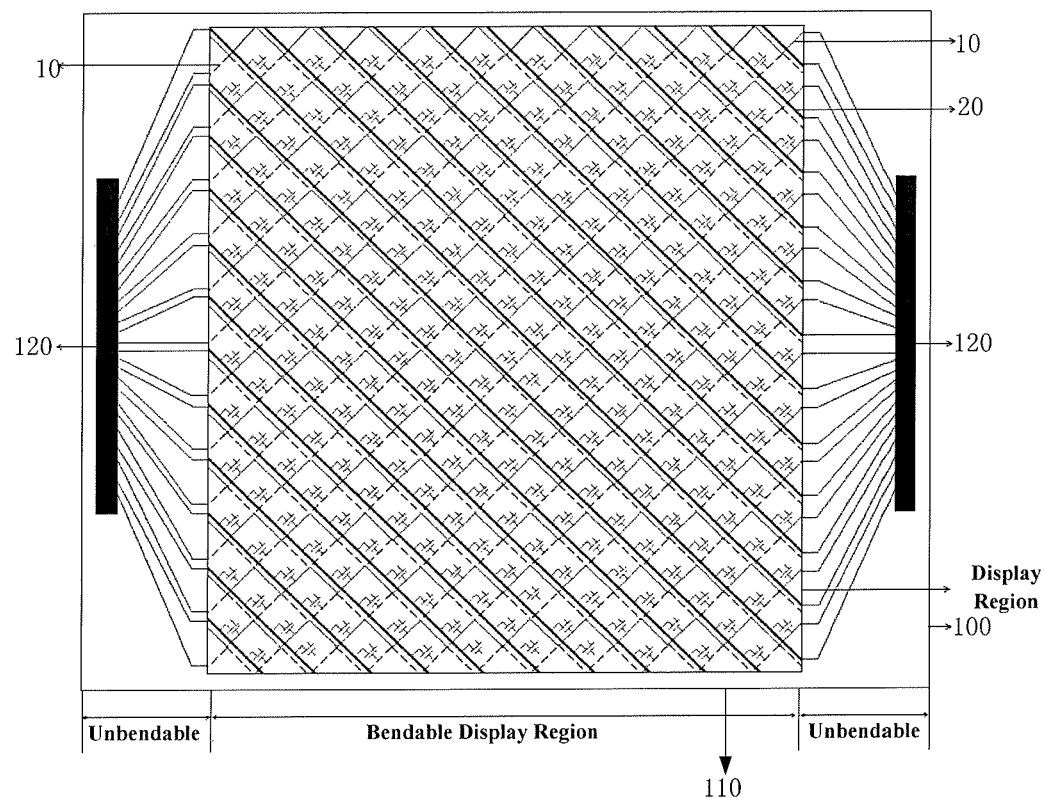
FIG. 5 is a planar view showing the array substrate according to an embodiment of the present disclosure.

As shown in FIGS. 4 and 5, the array substrate includes a flexible substrate 100 and an array layer formed on the flexible substrate 100. The array layer includes a display region and a non-display region, and a portion of a side 110 corresponding to the display region of the flexible substrate 100 is bendable. At the display region, the array layer includes:

signal transmission lines including a plurality of data lines 10 and a plurality of gate lines 20, which are arranged on the flexible substrate 100 in a crisscross manner so as to define a plurality of subpixel regions; and a TFT 30 arranged at each subpixel region and connected to the corresponding data line 10 and gate line 20, wherein at least portions of the signal transmission lines are formed as bending curves whose travelling direction is parallel to the bendable side 110 of the flexible substrate.

Referring to FIGS. 4 and 5, in the embodiments of the present disclosure, the gate line 10 is formed as a bending curve, and the data line 20 is formed as a straight line oblique to the side 110.

The side 110 is a horizontal side of the flexible substrate 100, i.e., a side which may be bent so as to enable the flexible substrate 100 to be bent in such a manner as shown in FIG. 2. However, the present disclosure is not limited to this bending mode.

To be specific, the gate line 10 formed as the bending curve includes at least one first line segment 11 angled at a first angle relative to the side 110 of the flexible substrate and at least one second line segment 12 angled at a second angle relative to the side 110 of the flexible substrate. The first line segment 11 is connected to the second line segment 12 at a top end, and the second line segment 12 is arranged between the two adjacent first line segments 11. Hence, the first line segments 11 and the second line segments 12 are arranged alternately along the side 110 and connected to each other in an end-to-end manner, so as to form a zigzag structure as shown in FIGS. 4 and 5.

Figure 6:
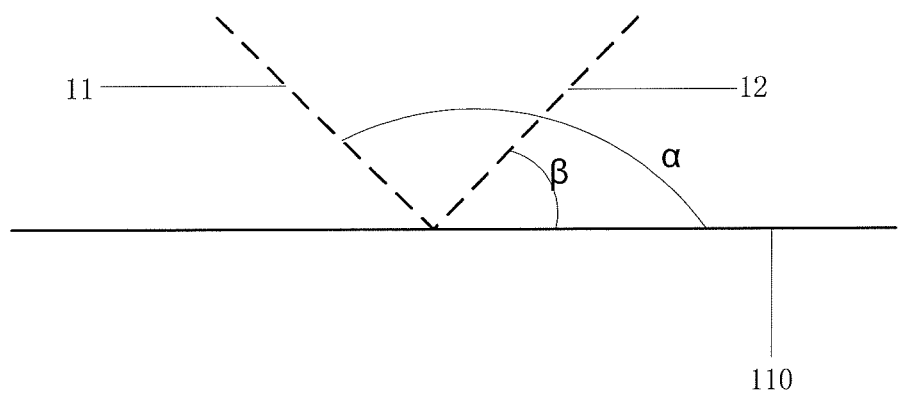
FIG. 6 is a schematic view showing an angle between a gate line and the side of the flexible substrate according to an embodiment of the present disclosure.

Referring to FIG. 6, identically a horizontally rightward direction of the side 110 is taken as the positive direction. An angle α between the first line segment 11 of the gate line 10 and the side 110 is between 90° and 180°, while an angle β between the second line segment 12 and the side 110 is between 0° and 90°. In one embodiment of the present disclosure, the angle α between the first line segment 11 of the gate line 10 and the side 110 is 135°, while the angle β between the second line segment 12 and the side 110 is 45°.

In addition, referring to FIGS. 4 and 5, the first line segment 11 is of a width identical to the second line segment 12, in a horizontal direction. For two adjacent gate lines 10, a second gate line (a dotted line) is of an identical shape and structure to a first gate line (a solid line), but offset from the first gate line to form a phase difference of 180°. In this way, the first line segments 11 of the gate lines 10 are arranged at a plurality of first straight lines parallel to each other, and the second line segments 12 are arranged at a plurality of second straight lines parallel to each other. It should be appreciated that, in the structures as shown in FIGS. 4 and 5, cutouts are provided inside, or at end points of, the second gate lines (the dotted lines) and the first gate lines (the solid lines) of the gate lines 10 so as to facilitate the drawing, but it does not mean that the gate lines 10 are broken at the cutouts.

An angle between the data line 20 and the side 110 is between 0° and 90°, or between 90° and 180°, and the data lines 20 are parallel to each other. Alternatively, the angle is 45° or 135°. In one embodiment of the present disclosure, the angle between the data line 20 and the side 110 of the flexible substrate is 135°.

Based on the above arrangement mode of the gate line 10 and the data line 20, the data line 20 is perpendicular to the second line segment 12 of the gate line 10, and parallel to the first line segment 11 of the gate line 10. The two adjacent data lines 10 intersect the second line segments 12 of the two adjacent gate lines 10 to define a pixel region. A TFT 30 is arranged in each pixel region and connected to the corresponding gate line 10 and data line 20.

It should be appreciated that, the structural relationship between the TFT 30 and the data line 20 or gate line 10 is simplified in the embodiments of the present disclosure. Usually, a gate electrode of the TFT 30 is connected to the gate line 10, a source (or drain) electrode thereof is connected to the data line 20, and a drain (or source) electrode thereof is connected to a pixel electrode (not shown). The drain and source electrodes of the TFT may be manufactured by a substantially identical manufacturing process, so they may be replaced with each other in the names.

In the embodiments of the present disclosure, the angles between the lines, and the lengths and the number thereof are described with respect to the lines in the display region. A bending state of the signal transmission lines arranged obliquely will be described hereinafter.

Figure 7:
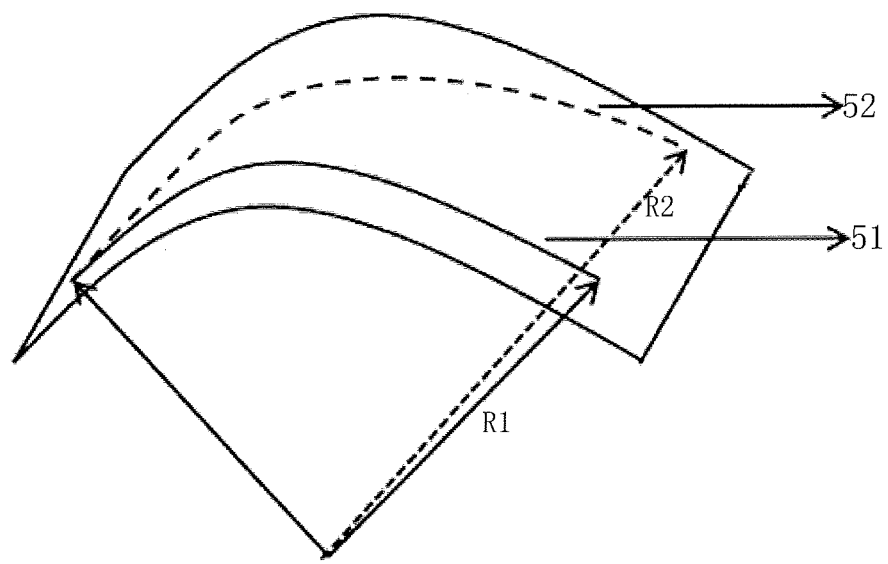
FIG. 7 is a schematic view showing the comparison of effects of the array substrate according to an embodiment of the present disclosure.

As shown in FIG. 7, presumed that a line 51 represents a first signal transmission line arranged parallel to the bent side 110 in the related art and a line 52 represents a second signal transmission line with a bent structure extending along the side 110 in the embodiment of the present disclosure, the second signal transmission line 52 is of a length greater than the first signal transmission line 51. In the bending state as shown in FIG. 7, a tip of the second signal transmission line 52 has a curve radius R2 which is greater than a curve radius R1 of a tip of the first signal transmission line 51. In other words, an average bending degree of the second signal transmission line 52 is lower than an average bending degree of the first signal transmission line 51.

Hence, as compared with the situation in the related art where the gate line is formed as a straight line parallel to the bent side of the flexible substrate, the gate line 10 formed as a bending curve in the embodiments of the present disclosure has a relatively small bending degree in the case that the array substrate is bent to the same extent.

Identically, as compared with the situation in the related art where the data line is formed as a straight line parallel to the bent side of the flexible substrate, the data line which is angled at 45° to the side 110 in the embodiments of the present disclosure has a relatively small bending degree in the case that the array substrate is bent to the same extent.

In the embodiments of the present disclosure, a portion of the signal transmission lines is formed as bending curves and the other portion of the signal transmission lines is formed as oblique straight lines relative to the bent side of the flexible substrate. As a result, it is able to reduce the bending degree of the signal transmission lines in the case that the array substrate is bent to the same extent, thereby to improve the bendability of the array substrate.

Figure 8:
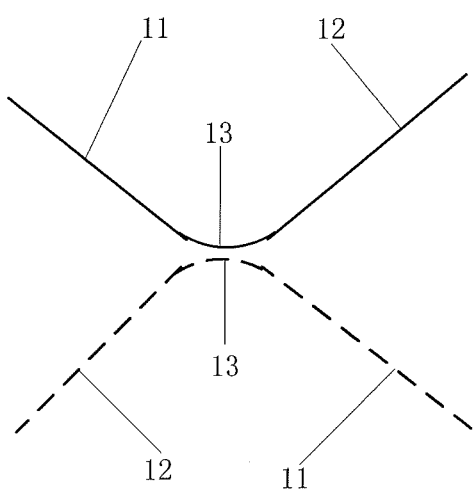
FIG. 8 is a partially enlarged view showing a gate line according to an embodiment of the present disclosure.

Referring to FIG. 4, for the two adjacent gate lines 10, the bending curves are arranged closely adjacent to each other at an apex angle 13 where the first line segment 11 is connected to the second line segment 12. In order to prevent the occurrence of static breakdown, the apex angle 13 is formed as an arc, e.g., as shown in FIG. 8.

Figure 9:
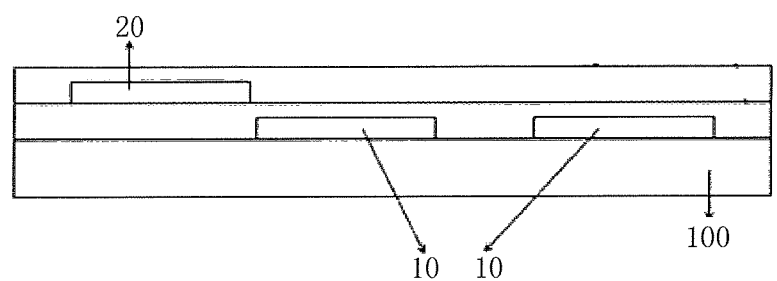
FIG. 9 is a sectional view of the array substrate according to an embodiment of the present disclosure.

In addition, as shown in FIG. 9, which is a sectional view of the array substrate, when forming the array substrate, the gate lines 10 and the data lines 20 are sequentially formed on the flexible substrate 100. The data lines 20 are arranged at an identical layer, the gate lines 10 are arranged at an identical layer, and the data lines 20 and the gate lines 10 are arranged at different layers and separated from each other by an insulating layer.

In one embodiment of the present disclosure, as shown in FIG. 5, the array substrate further includes a driving module 120 configured to output driving signals to the gate lines and the data lines.

In order to protect the driving module 120, the flexible substrate may be divided into a bendable display region and an unbendable non-display region, and the driving module 120 is arranged at the non-display region.

The non-display region is of a relatively greater strength, so it is of less possibility to be bent relative to the display region. When the driving module is arranged at the non-display region, it is able to protect it in a better manner.

In the embodiments of the present disclosure, there may be one or more driving modules. When two driving modules are provided, they are arranged at two opposite sides of the flexible substrate, respectively, and connected to the data lines and gate lines according to a principle of connecting to a closer module.

In the embodiments of the present disclosure, the driving module is configured to drive the data lines and the gate lines simultaneously. It should be appreciated that, the driving module may include a data driving module for driving the data lines individually and a gate driving module for driving the gate lines individually. The gate driving module may be an independent chip.

In addition, referring to FIG. 5, in the embodiments of the present disclosure, at least two data lines have different lengths after the data lines are arranged obliquely, and the number of the TFTs connected to the at least two data lines is different from each other. Hence, the number of data driving sub-signals from the driving module to different data lines is different from each other.

A person skilled in the art should know the connection relationship between the driving module and the signal transmission lines as well as the method for forming the signal transmission lines on the array substrate, which will not be particularly defined herein.

The above description is given when the gate line is formed as the bending curve and the data line is formed as the oblique straight line relative to the side of the flexible substrate. It should be appreciated that, when the data line is formed as the bending curve and the gate line is formed as the oblique straight line, the principles and arrangement modes are the same, which will not be repeated herein.

The present disclosure further provides in one embodiment a flexible display device including the above-mentioned array substrate. The structure and the working principle of the array substrate are mentioned above, and will thus not be repeated herein. In addition, the other components of the flexible display device may refer to the related art, and they will not be particularly defined herein. The flexible display device may be any product or member having a display function, such as a liquid crystal panel, an electronic paper, a liquid crystal TV, a liquid crystal display, a digital photo frame, a mobile phone and a flat panel computer.

The present disclosure further provides in one embodiment an electronic device including the above-mentioned flexible display device.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising a flexible substrate, and an array layer formed on the flexible substrate, the flexible substrate being bendable, wherein the array layer comprises:
   signal transmission lines including a plurality of data lines and a plurality of gate lines which are arranged on the flexible substrate in a crisscross manner so as to define a plurality of subpixel regions; and
   a thin film transistor (TFT) arranged at each subpixel region and connected to the corresponding data line and gate line,
   wherein at least portions of the signal transmission lines are formed as bending curves whose travelling direction is parallel to a side of the flexible substrate.

2. The array substrate according to claim 1, wherein the bending curve is of a zigzag shape.

3. The array substrate according to claim 1, wherein the side of the flexible substrate is bendable.

4. The array substrate according to claim 1, wherein one of the data line and the gate line is a bending curve, while the other one of the data line and the gate line is an oblique straight line.

5. The array substrate according to claim 4, wherein the signal transmission lines formed as the bending curves comprise a plurality of first line segments angled at a first angle relative to the side of the flexible substrate and a plurality of second line segments angled at a second angle relative to the side of the flexible substrate, and the plurality of first line segments and the plurality of second line segments are arranged alternately and connected to each other in an end-to-end manner.

6. The array substrate according to claim 5, wherein the first line segments of the signal transmission lines are arranged at a plurality of first straight lines parallel to each other, and the second line segments are arranged at a plurality of second straight lines parallel to each other.

7. The array substrate according to claim 5, wherein the first line segment is connected to the second line segment in an arc connection manner.

8. The array substrate according to claim 6, wherein the signal transmission lines formed as the oblique straight lines intersect one of the first line segments and the second line segments, so as to define the subpixel region.

9. The array substrate according to claim 8, wherein the signal transmission lines formed as the oblique straight lines are parallel to the other one of the first line segments and the second line segments.

10. The array substrate according to claim 4, wherein the oblique straight line is angled at 45° or 135° relative to the side of the flexible substrate.

11. The array substrate according to claim 4, wherein at regions where the data lines and the gate lines intersect each other, the data lines are perpendicular to the gate lines.

12. The array substrate according to claim 1, wherein the gate lines and the data lines are formed on the flexible substrate sequentially, the data lines are arranged at an identical layer, the gate lines are arranged at an identical layer, and the data lines and the gate lines are arranged at different layers and separated from each other by an insulating layer.

13. The array substrate according to claim 1, further comprising a driving module configured to output driving signals to the data lines and the gate lines.

14. The array substrate according to claim 13, wherein the flexible substrate comprises a bendable display region and an unbendable non-display region, and the driving module is arranged at the non-display region.

15. The array substrate according to claim 13, wherein the driving module is configured to drive the data lines and the gate lines simultaneously, or includes a data driving module for driving the data lines individually and a gate driving module for driving the gate lines individually.

16. A flexible display device comprising the array substrate according to claim 1.

17. An electronic device comprising the flexible display device according to claim 16.

18. The flexible display device according to claim 16, wherein the side of the flexible substrate is bendable.

19. The flexible display device according to claim 16, wherein one of the data line and the gate line is a bending curve, while the other one of the data line and the gate line is an oblique straight line.

20. The flexible display device according to claim 16, wherein the bending curve is of a zigzag shape.

* * * * *